United States Patent
Maekawa et al.

(10) Patent No.: US 10,629,763 B2
(45) Date of Patent: Apr. 21, 2020

(54) SOLAR CELL MODULE

(71) Applicant: PANASONIC INTELLECTUAL PROPERTY MANAGEMENT CO., LTD., Osaka (JP)

(72) Inventors: Akimichi Maekawa, Osaka (JP); Junpei Irikawa, Osaka (JP); Tasuku Ishiguro, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/146,354

(22) Filed: Sep. 28, 2018

(65) Prior Publication Data

US 2019/0035963 A1 Jan. 31, 2019

Related U.S. Application Data

(63) Continuation-in-part of application No. PCT/JP2017/011978, filed on Mar. 24, 2017.

(30) Foreign Application Priority Data

Mar. 31, 2016 (JP) ................................. 2016-071808

(51) Int. Cl.
*H01L 31/05* (2014.01)
*H01L 31/054* (2014.01)
*H01L 31/049* (2014.01)

(52) U.S. Cl.
CPC ........ *H01L 31/0547* (2014.12); *H01L 31/049* (2014.12); *Y02E 10/52* (2013.01)

(58) Field of Classification Search
CPC ........... H01L 31/0547; H01L 31/02008; H01L 31/0203; H01L 31/02327; H01L 31/0236;
(Continued)

(56) References Cited

U.S. PATENT DOCUMENTS

2011/0005592 A1* 1/2011 Kataoka ............ B32B 17/10018
136/256
2013/0298965 A1 11/2013 Liu et al.
(Continued)

FOREIGN PATENT DOCUMENTS

JP 2005-50928 A 2/2005
JP 2009-179810 A 8/2009
(Continued)

OTHER PUBLICATIONS

International Search Report and Written Opinion issued in International Patent Application No. PCT/JP2017/011978, dated May 16, 2017; with partial English translation.
(Continued)

*Primary Examiner* — Susan D Leong
(74) *Attorney, Agent, or Firm* — McDermott Will & Emery LLP

(57) ABSTRACT

A solar cell module includes: two solar cells adjacent one another across a space; an elongated light reflector extending over the two solar cells; and a front protector covering front surfaces of the two solar cells and the light reflector. In a plan view of the two solar cells, each of the two solar cells has chamfered corners and a substantially octagonal shape with linear long sides and linear or non-linear short sides, connected alternately. The light reflector, in the plan view, protrudes in the longitudinal direction from an intersection between a first long side facing another long side across the space, among the long sides, and a first short side one end of which is connected to the first long side, among the short sides, to cause light reflected by the uneven structure of the light-reflective film to reach at least one of the two solar cells.

5 Claims, 9 Drawing Sheets

(58) Field of Classification Search
CPC .............. H01L 31/0352; H01L 31/042; H01L 31/0465; H01L 31/048; H01L 31/05; H01L 31/0508; H01L 31/0516; H01L 31/054

See application file for complete search history.

(56) References Cited

U.S. PATENT DOCUMENTS

| | | |
|---|---|---|
| 2013/0340804 A1 | 12/2013 | Moon et al. |
| 2014/0116495 A1 | 5/2014 | Kim et al. |
| 2014/0360583 A1 | 12/2014 | Maeda |
| 2015/0059831 A1 | 3/2015 | Fukumochi et al. |
| 2019/0123227 A1 | 4/2019 | Maeda |

FOREIGN PATENT DOCUMENTS

| | | | | |
|---|---|---|---|---|
| JP | 2014-007384 A | 1/2014 | | |
| JP | 2014-183289 A | 9/2014 | | |
| JP | 2015-056493 A | 3/2015 | | |
| WO | WO-2007041922 A1 * | 4/2007 | ......... | H01L 31/0547 |
| WO | 2013/132654 A1 | 9/2013 | | |
| WO | 2013/168612 A1 | 11/2013 | | |

OTHER PUBLICATIONS

Japanese Office Action dated Jul. 30, 2019 for the corresponding Japanese patent application No. 2018-509234.

\* cited by examiner

L > T

L < T

SOLAR CELL MODULE

CROSS REFERENCE TO RELATED APPLICATIONS

This application is a continuation-in-part of PCT International Patent Application Number PCT/JP2017/011978 filed on Mar. 24, 2017, claiming the benefit of priority of Japanese Patent Application Number 2016-071808 filed on Mar. 31, 2016, the entire contents of which are hereby incorporated by reference.

BACKGROUND

1. Technical Field

The present disclosure relates to a solar cell module.

2. Description of the Related Art

In recent years, solar cell modules have been progressively developed as photoelectric conversion devices which convert light energy into electric energy. Solar cell modules can directly convert inexhaustible sunlight into electricity, and thus have less environmental impact and generate power more cleanly than power generation using fossil fuels. Accordingly, such solar cell modules are expected to provide new energy sources.

For example, a solar cell module has a structure in which solar cells are sealed by an encapsulant between a front protector and a back protector. In the solar cell module, the plurality of solar cells are disposed in a matrix.

Conventionally, a solar cell module has been proposed in which in order to improve photoelectric conversion efficiency by effectively using sunlight irradiating spaces between solar cells, light reflectors are provided in the spaces between the solar cells (for example, Japanese Unexamined Patent Application Publication No. 2014-183289).

SUMMARY

When light reflectors are used, a solar cell module with improved photoelectric conversion efficiency can be realized but it increases manufacturing costs of the solar cell module. For this reason, there is a demand for a solar cell module characterized by a low manufacturing cost relative to the output of the solar cell module, and such a solar cell module is desired to improve photoelectric conversion efficiency and reduce an associated increase in manufacturing costs.

Therefore, an object of the present disclosure is to provide a solar cell module which can improve photoelectric conversion efficiency and reduce an increase in manufacturing costs.

In order to achieve the above object, a solar cell module according to an aspect of the present disclosure includes: two solar cells adjacent one another across a space; a light reflector that extends over the two solar cells, includes a light-reflective film and an insulating member, and has an elongated shape; a front protector that covers front surfaces of the two solar cells and the light reflector; and a front-surface side encapsulant disposed between (i) the two solar cells and the light reflector, and (ii) the front protector. In a plan view of the two solar cells, each of the two solar cells has chamfered corners and a substantially octagonal shape with long sides that are linear and short sides that are linear or non-linear, connected alternately. The light-reflective film has an uneven structure defined by recesses and protrusions that alternate in a direction crossing a longitudinal direction of the light reflector. The light reflector, in the plan view, protrudes in the longitudinal direction from an intersection between a first long side facing another long side across the space, among the long sides, and a first short side one end of which is connected to the first long side, among the short sides, to cause light reflected by the uneven structure of the light-reflective film to reach at least one of the two solar cells. In the plan view, a protruding length of the light reflector from the intersection is determined based on: a width of the space; a width of the light reflector; an exterior angle at an intersection between a second long side, among the long sides, connected to an other end of the first short side and the first short side; and a horizontal distance from a first point on the light reflector to a second point in a horizontal plane including the at least one of the two solar cells, of light that is incident and reflected at the first point, subsequently reflected by the front protector, and reaches the second point.

A solar cell module according to the present disclosure can improve photoelectric conversion efficiency and reduce an increase in manufacturing costs.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

The following will describe a solar cell module according to embodiments of the present disclosure in detail with reference to the drawings. The embodiments described below each illustrate a particular example of the present disclosure. Thus, the numerical values, shapes, materials, elements, the arrangement and connection of the elements, processes, etc., indicated in the following embodiments are mere examples, and are not intended to limit the present disclosure. Therefore, among the elements in the following embodiments, elements not recited in any of the independent claims defining the most generic concept of the present disclosure are described as optional elements.

The drawings are schematic and do not necessarily provide precise depictions. Throughout the drawings, like elements share like reference signs.

In this description, a "front surface" of a solar cell denotes a surface through which more light can enter in comparison to a "back surface", which is a surface opposite the front surface (at least 50% to 100% of light enters from the front surface), and examples of the front surface include a surface which no light enters from a "back surface" side. In addition, a "front surface" of a solar cell module denotes a surface through which light on a "front surface" side of the solar cell can enter, and a "back surface" of the solar cell module denotes a surface opposite the front surface of the solar cell module. It should be noted that, unless specifically limited, an expression such as "provide a second member on a first member" is not intended only for a case in which the first and second members are provided in direct contact with each other. In other words, examples of this expression include a case in which another member is disposed between the first and second members.

Embodiment

[1. Configuration of Solar Cell Module]

First, a schematic configuration of solar cell module 1 according to the embodiment will be described with reference to FIG. 1 and FIG. 2.

Figure 1:
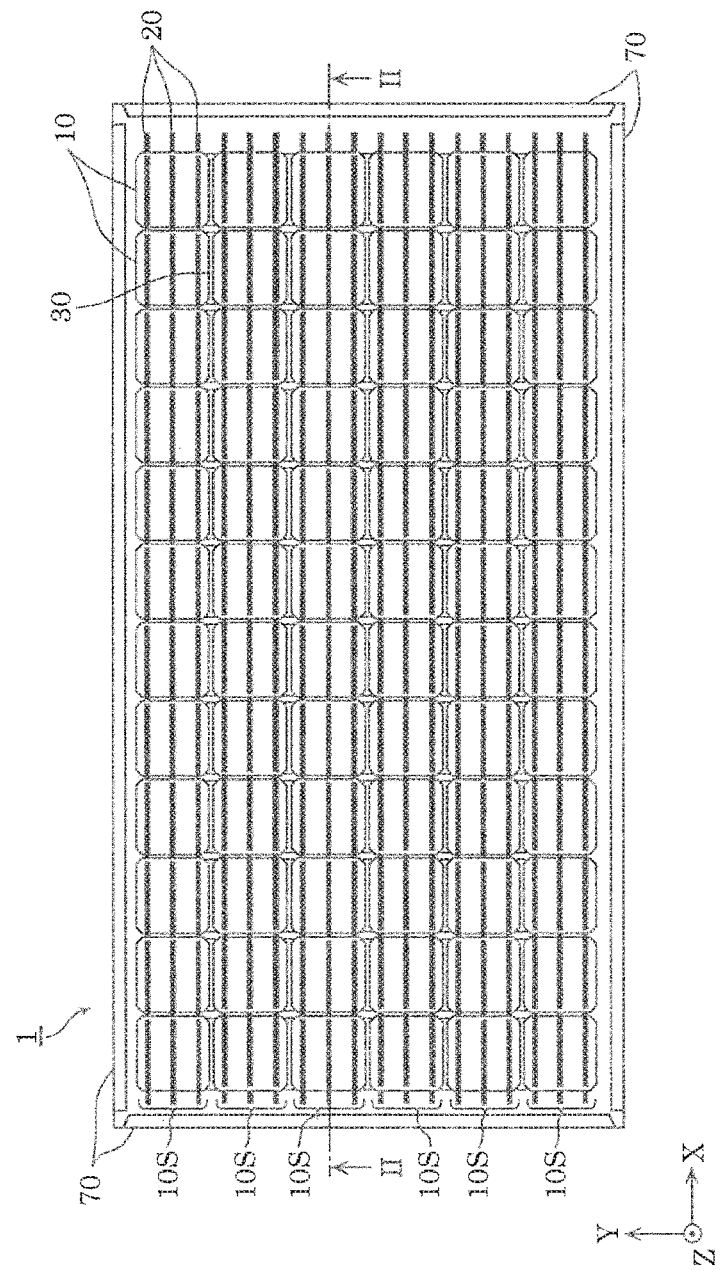
FIG. 1 is a plan view of a solar cell module according to an embodiment.

FIG. 1 is a plan view of solar cell module 1 according to the embodiment. FIG. 2 is a cross-sectional view of solar cell module 1, taken along the line II-II of FIG. 1.

Figure 2:
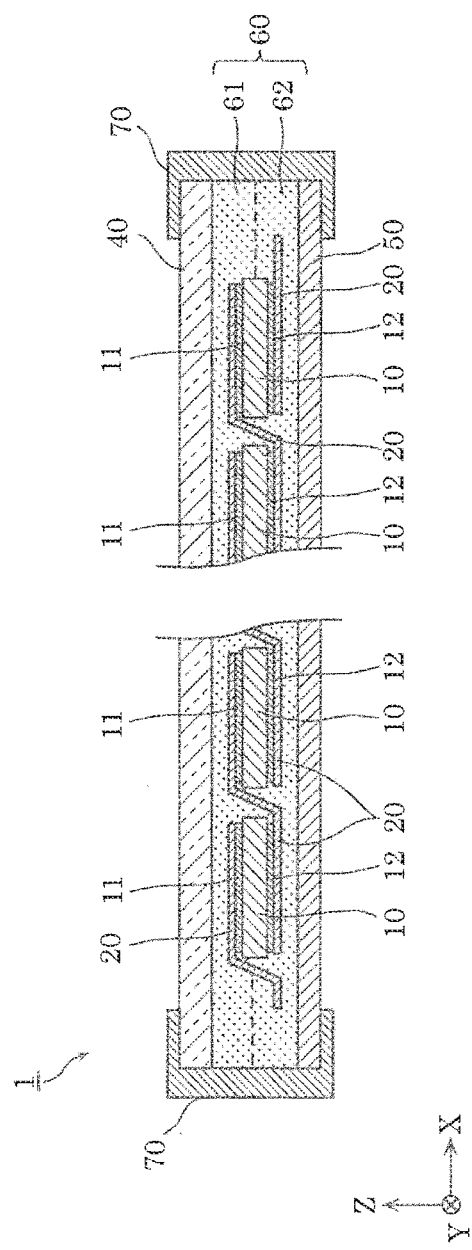
FIG. 2 is a cross-sectional view of the solar cell module, taken along the II-II line of FIG. 1.

In FIG. 1 and FIG. 2, the Z axis is perpendicular to the principal surface of solar cell module 1, and the X axis and the Y axis are orthogonal to each other and are both orthogonal to the Z axis. The same applies to the Z axis, the X axis, and the Y axis in the other drawings as well.

As illustrated in FIG. 1 and FIG. 2, solar cell module 1 includes a plurality of solar cells 10, first line 20, light reflector 30, front protector 40, back protector 50, encapsulant 60, and frame 70. Solar cell module 1 has a structure in which solar cells 10 are sealed by encapsulant 60 between front protector 40 and back protector 50.

As illustrated in FIG. 1, the shape of solar cell module 1 in a plan view is quadrilateral. As an example, solar cell module 1 has a quadrilateral shape having a length of about 1,600 mm and a width of about 800 mm.

Figure 3:
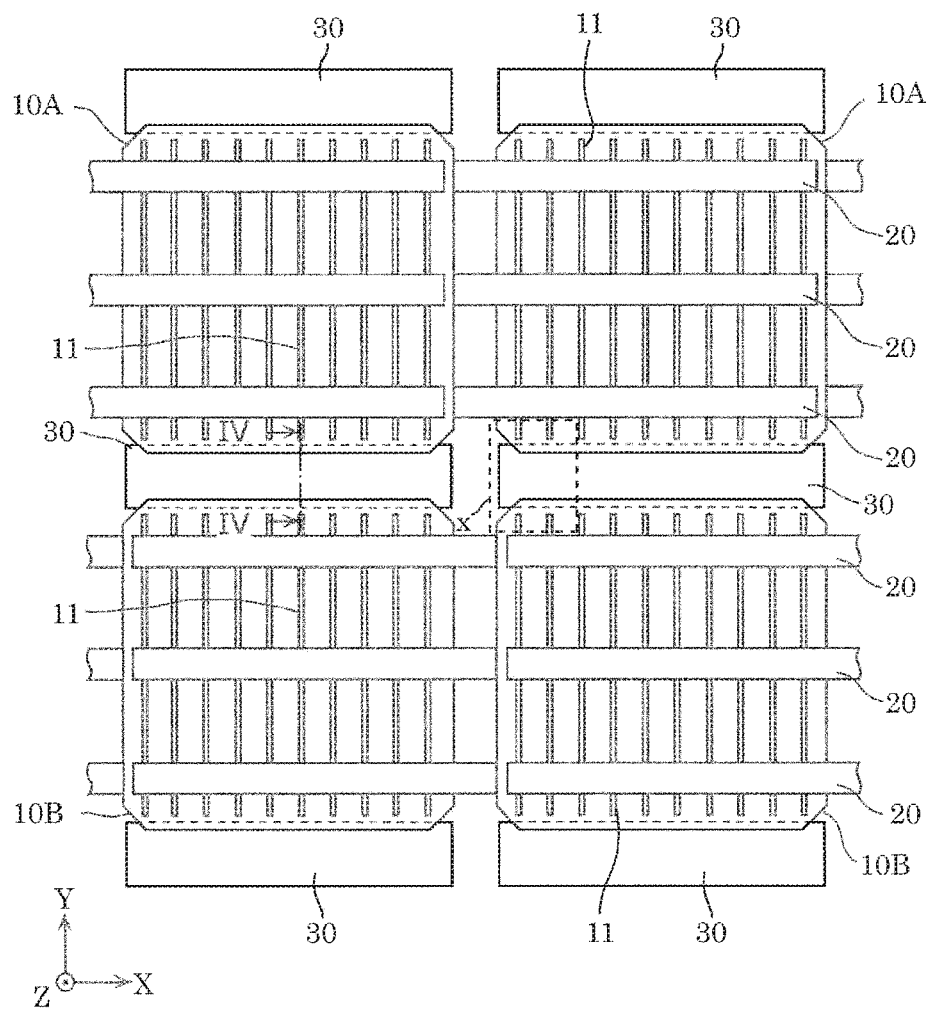
FIG. 3 is an enlarged plan view when the solar cell module according to the embodiment is viewed from the front surface side.
Figure 4A:
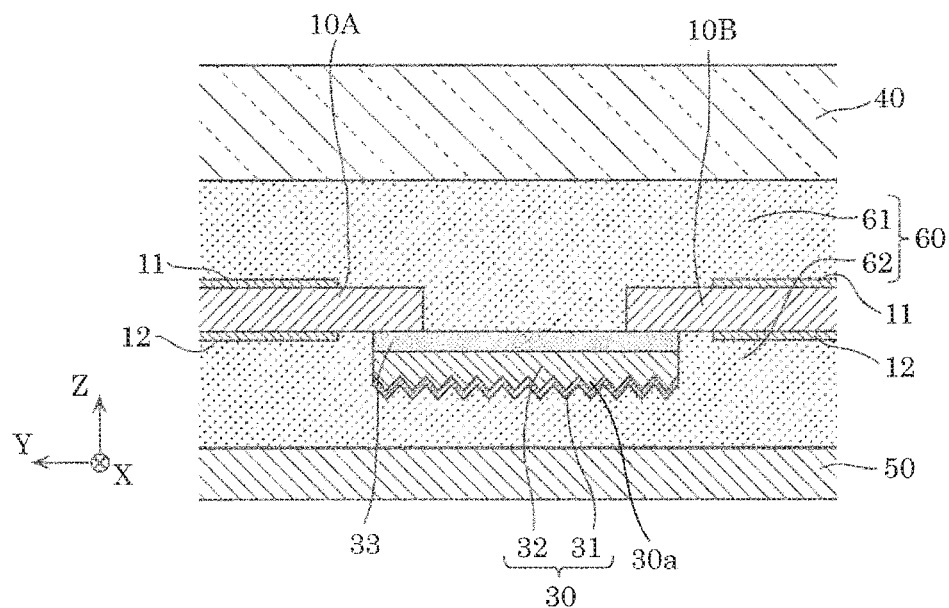
FIG. 4A is a cross-sectional view (enlarged cross-sectional view around a light reflector) of the solar cell module, taken along the Iv-Iv line of FIG. 3.

The following will describe components of solar cell module 1 in more detail with reference to FIG. 1 and FIG. 2, and also FIG. 3 and FIG. 4A.

FIG. 3 is an enlarged plan view of solar cell module 1 according to the embodiment, viewed from the front surface side. In other words, FIG. 3 illustrates a state seen through from the main light-receiving surface side (front protector 40 side). FIG. 4A is a cross-sectional view of solar cell module 1 according to the embodiment, taken along the IV-IV line of FIG. 3. FIG. 4A is an enlarged cross-sectional view around light reflector 30.

[1-1. Solar Cell (Photovoltaic Cell)]

Solar cell 10 is a photoelectric conversion element (photovoltaic element) which converts light such as sunlight into power. As illustrated in FIG. 1, the plurality of solar cells 10 are disposed in rows and columns (a matrix) in the same plane.

Two adjacent solar cells 10 among the plurality of solar cells 10 linearly aligned are connected by first lines 20 to form a string (cell string). The plurality of solar cells 10 in one string 10S are electrically connected in series by first lines 20.

As illustrated in FIG. 1, in this embodiment, 12 solar cells 10 disposed at equal intervals in a row direction (the X axis direction) are connected by first lines 20 to form one string 10S. And, a plurality of strings 10S are formed. The plurality of strings 10S are disposed in a column direction (the Y axis direction). In this embodiment, six strings 10S are disposed at equal intervals along the column direction, parallel to one another, as illustrated in FIG. 1.

It should be noted that each string 10S is connected to second lines (not illustrated) via first lines 20. Because of this, the plurality of strings 10S are connected in series or parallel to one another to constitute a cell array. In this embodiment, two adjacent strings 10S are connected in series to constitute a series connection body (a series connection body of 24 solar cells 10), and three series connection bodies of such are connected in series to constitute a series connection body of 72 solar cells 10.

As illustrated in FIG. 1 and FIG. 3, the plurality of solar cells 10 are disposed such that solar cells adjacent in the row direction and the column direction have a space therebetween. As described below, light reflectors 30 are disposed in the spaces.

Solar cell 10 has a quadrilateral shape in a plan view. Specifically, solar cell 10 has a quadrilateral shape with chamfered corners. For example, solar cell 10 has a substantially octagonal shape with long sides that are linear, and short sides that are linear or non-linear, connected alternately. In this embodiment, solar cell 10 has a substantially octagonal shape with long sides that are linear and short sides that are linear, connected alternately. Solar cell 10 has a quadrilateral shape and is, for example, a 125-mm square with chamfered corners. As illustrated in FIG. 3, for example, solar cells 10, each of which is included in a different string 10S, are called solar cell 10A and solar cell 10B, respectively. One side of one of the two adjacent solar cells 10A (10B) included in one string 10S faces one side of the other of the two adjacent solar cells 10A (10B). Since the space between solar cell 10A and solar cell 10B becomes large around the corners of solar cells 10, the distance between light reflector 30 disposed in the space and solar cell 10 becomes large around the corners, as illustrated in FIG. 3. When referred to as merely solar cell 10 below, it may be either of solar cell 10A or solar cell 10B.

The basic structure of solar cell 10 is a semiconductor p-n junction, and as an example, solar cell 10 includes an n-type monocrystalline silicon substrate which is an n-type semiconductor substrate, an n-type amorphous silicon layer and an n-side electrode which are sequentially formed on a principal surface side of the n-type monocrystalline silicon substrate, and a p-type amorphous silicon layer and a p-side electrode which are sequentially formed on the other principal surface side of the n-type monocrystalline silicon substrate. Between the n-type monocrystalline silicon substrate and the n-type amorphous silicon layer, however, a passivation layer such as an i-type amorphous silicon layer, a silicon oxide layer, or a silicon nitride layer may be provided. A passivation layer may also be provided between the n-type monocrystalline silicon substrate and the p-type amorphous silicon layer. The n-side electrode and the p-side electrode are transparent electrodes including ITO (Indium Tin Oxide), for example.

It should also be noted that, in the embodiment, solar cell 10 is disposed such that the n-side electrode is disposed on the main light-receiving surface side (front protector 40 side) of solar cell module 1 but is not limited to such. Furthermore, when solar cell module 1 is a monofacial module, an electrode located on the back surface side (the p-side electrode in the embodiment) is not necessarily transparent, and may be a reflective metal electrode, for example.

In each solar cell 10, a front surface is a surface on the front protector 40 side, and a back surface is a surface on the back protector 50 side. As illustrated in FIG. 2 and FIG. 4A, front-side collector electrode 11 and back-side collector electrode 12 are formed on solar cell 10. Front-side collector electrode 11 is electrically connected to the front-surface side electrode (for example, the n side electrode) of solar cell 10. Back-side collector electrode 12 is electrically connected to the back-surface side electrode (for example, the p side electrode) of solar cell 10.

Front-side collector electrode 11 and back-side collector electrode 12 each include, for example, a plurality of finger electrodes formed linearly and orthogonal to the direction in which first lines 20 extend, and a plurality of bus bar electrodes connected to the finger electrodes and formed linearly in the direction orthogonal to the finger electrodes (the direction in which first lines 20 extend). The number of bus bar electrodes is the same as, for example, the number of first lines 20, and is three in this embodiment. Front-side collector electrode 11 and back-side collector electrode 12 have the same shape, which is not limited to such.

Front-side collector electrode 11 and back-side collector electrode 12 include a conductive material having low resistance, such as silver (Ag). For example, front-side collector electrode 11 and back-side collector electrode 12 can be formed by screen printing a conductive paste (such as silver paste) obtained by dispersing conductive filler such as silver in a binder resin, in a predetermined pattern.

In solar cell 10 having such a structure, both the front surface and the back surface serve as light-receiving surfaces. When light enters solar cell 10, charge carriers are generated in a photoelectric converter of solar cell 10. The generated charge carriers are collected by front-side collector electrode 11 and back-side collector electrode 12, and flow to first lines 20. The charge carriers generated in solar cell 10 can be efficiently taken out to an external circuit by disposing front-side collector electrode 11 and back-side collector electrode 12 as described above.

[1-2. First Line (Interconnector)]

As illustrated in FIG. 1 and FIG. 2, first lines 20 (interconnector) electrically connect the two adjacent solar cells 10 in string 10S. As illustrated in FIG. 1 and FIG. 3, in this embodiment, the two adjacent solar cells 10 are connected by three first lines 20 disposed substantially parallel to each other. Each first line 20 extends in the alignment direction of the two solar cells 10 to be connected. As illustrated in FIG. 2, with regard to each first line 20, one end portion of first line 20 is disposed on the front surface of one of the two adjacent solar cells 10, and the other end portion of first line 20 is disposed on the back surface of the other of the two adjacent solar cells 10. Each first line 20 electrically connects front-side collector electrode 11 of one of the two adjacent solar cells 10 to back-side collector electrode 12 of the other of the two adjacent solar cells 10. For example, first lines 20, and bus bar electrodes of front-side collector electrode 11 and back-side collector electrode 12 on solar cells 10 are bonded together with a conductive adhesive such as a solder material or a resin adhesive. When first lines 20 and bus bar electrodes of front-side collector electrode 11 and back-side collector electrode 12 on solar cell 10 are bonded together with a resin adhesive, the resin adhesive may contain conductive particles.

First lines 20 are conductive elongated lines, and are ribbon-shaped metallic foil, for example. First lines 20 can be produced by cutting, for example, metallic foil, such as copper foil or silver foil having a surface entirely covered with solder, silver, or the like into strips having a predetermined length.

[1-3. Light Reflector]

As illustrated in FIG. 3 and FIG. 4A, light reflector 30 extends over two solar cells 10A and 10B. In other words, light reflector 30 extends over the two solar cells 10A and 10B included in adjacent strings 10S. In this embodiment, light reflector 30 is disposed on the back surface side of solar cell 10. In other words, light reflector 30 extends over the back surfaces of the two solar cells 10A and 10B. As illustrated in FIG. 3, light reflector 30 has an elongated shape, and includes light-reflective film 31 and insulating member 32.

As illustrated in FIG. 4A, light-reflective film 31 is formed on the surface on which recesses and protrusions 30a of insulating member 32, described below, are formed. Light-reflective film 31 is a metal film (metal reflective film) including metal such as, for example, aluminum or silver. Light-reflective film 31 which is a metal film is formed on the surface of recesses and protrusions 30a of insulating member 32 by, for example, vapor deposition. Accordingly, the surface shape of light-reflective film 31 is given irregularities that conform to the irregularities of recesses and protrusions 30a of insulating member 32. Thus, light-reflective film 31 has an uneven structure defined by recesses and protrusions that alternate in a direction crossing the longitudinal direction (X axis direction) of light reflector 30, which is, for example, perpendicular to the longitudinal direction of light reflector 30 (in the Y axis direction) (See FIG. 5C below). Because of this, light-reflective film 31 reflects incident light on light-reflective film 31 toward solar cell 10 (in the Y axis direction).

Insulating member 32 is disposed between the back surfaces of the two solar cells 10 and light-reflective film 31. Insulating member 32 is present closer to the main light-receiving surface of solar cell module 1 than light-reflective film 31 is. For this reason, insulating member 32 has light-transmitting properties and examples of material of insulating member 32 include a light-transmitting material such as a transparent material, to cause light that enters from the main light-receiving surface of solar cell module 1 to be reflected by the surface on the main light-receiving surface side of light-reflective film 31.

Examples of specific material of insulating member 32 include polyethylene terephthalate (PET) and an acrylic resin, and insulating member 32 is a transparent PET sheet in this embodiment.

Recesses and protrusions 30a are formed on insulating member 32. With regard to recesses and protrusions 30a, for example, the height between a recess (bottom) and a protrusion (peak) is at least 5 μm and at most 100 μm, and the spacing (intervals) between adjacent protrusions is at least 20 μm and at most 400 μm. In this embodiment, the height between a recess and a protrusion is 12 μm and the spacing (intervals) between adjacent protrusions is 40 μm.

In this embodiment, light reflector 30 is bonded to solar cell 10 by adhesive member 33 formed on the solar cell 10 side of insulating member 32. Adhesive member 33 is disposed between insulating member 32 and solar cell 10, and bonds insulating member 32 to solar cell 10. Adhesive member 33 is disposed on the entire surface of insulating member 32. Adhesive member 33 is a thermal adhesive or a pressure-sensitive adhesive including EVA, for example, and a material of adhesive member 33 is a light-transmitting material. Because of this, light reflector 30 can be bonded and fixed to solar cell 10 by thermo compression bonding. In this embodiment, insulating member 32 and light-reflective film 31 are included in light reflector 30, yet in addition to insulating member 32 and light-reflective film 31, adhesive member 33 may be included in light reflector 30. In other words, light reflector 30 may be a three-layered structure having light-reflective film 31, insulating member 32, and adhesive member 33.

Light that enters the space between solar cell 10A and solar cell 10B is reflected by the surface of light reflector 30. The reflected light is again reflected by the boundary surface between front protector 40 and the exterior space of solar cell module 1 to fall on solar cell 10. This enables the photoelectric conversion efficiency of the whole solar cell module 1 to be improved. The reflected light will be described in detail with reference to FIG. 5A to FIG. 5C below.

It should be noted that light reflector 30 is not necessarily disposed on the back surface of solar cell 10.

Figure 4B:
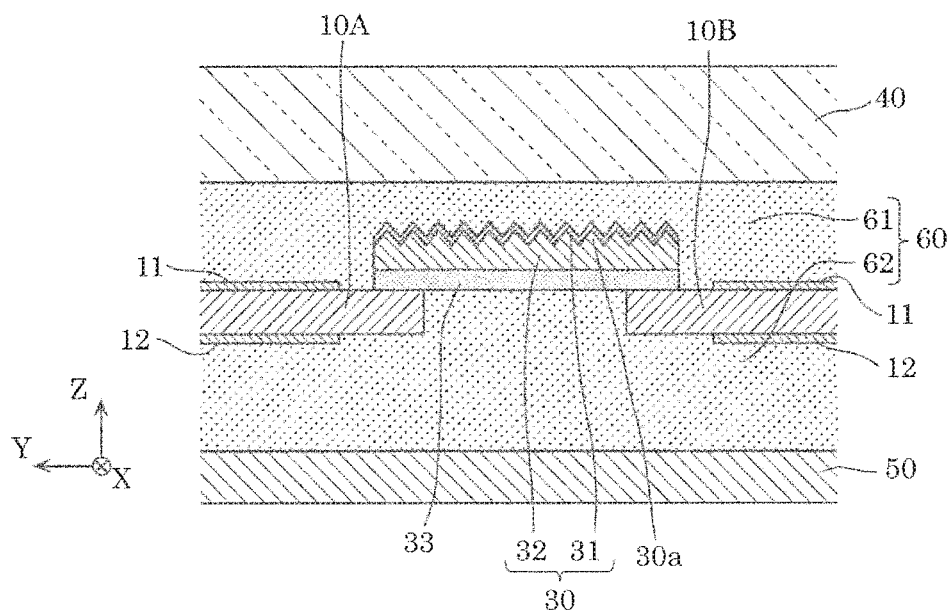
FIG. 4B is a cross-sectional view (enlarged cross-sectional view around a light reflector) of the solar cell module according to a variation of the embodiment.

FIG. 4B is a cross-sectional view (enlarged cross-sectional view around light reflector 30) of solar cell module 1 in a variation of the embodiment. As illustrated in FIG. 4B, light reflector 30 may be disposed on the front surface side of solar cells 10.

When light reflector 30 is disposed on the front surface side of solar cell 10, however, an effectual region (power generation region) of solar cell 10 may be shaded by light reflector 30 in an overlapping portion of solar cell 10 with light reflector 30, which blocks light from entering the effectual region. In contrast, disposing light reflector 30 on the back surface side of solar cell 10 reduces such blocking of light.

[1-4. Front Protector, Back Protector]

Front protector 40 is a member which protects the front surface of solar cell module 1, and protects the inside of solar cell module 1 (such as solar cell 10) from the outside environment such as rainstorm and an external shock. As illustrated in FIG. 2, front protector 40 is disposed on the front surface side of solar cell 10, and protects the light-receiving surface on the front surface side of solar cell 10.

Front protector 40 includes a light-transmitting member which transmits light in a wavelength range used for photoelectric conversion in solar cell 10. Front protector 40 is, for example, a glass substrate (transparent glass substrate) including a transparent glass material or a resin substrate including a hard resin material having a film-like or plate-like shape and light-transmitting and water shielding properties.

On the other hand, back protector 50 is a member which protects the back surface of solar cell module 1, and protects the inside of solar cell module 1 from the outside environment. As illustrated in FIG. 2, back protector 50 is disposed on the back surface side of solar cell 10, and protects the light-receiving surface on the back surface side of solar cell 10.

Back protector 50 is a film-like or plate-like resin sheet including a resin material such as polyethylene terephthalate (PET) or polyethylene naphthalate (PEN), for example.

When solar cell module 1 is a monofacial module, back protector 50 may be a non light-transmitting plate or film. However, back protector 50 is not limited to a non light-transmitting member, and may be a light-transmitting member such as a glass sheet or a glass substrate including a glass material.

[1-5. Encapsulant]

Encapsulant (filler) 60 is provided between front protector 40 and back protector 50. Front protector 40 and back protector 50 are bonded and fixed to solar cell 10 by encapsulant 60. In this embodiment, encapsulant 60 fills up a space between front protector 40 and back protector 50.

As illustrated in FIG. 4A, encapsulant 60 includes front-surface side encapsulant 61 and back-surface side encapsulant 62. Front-surface side encapsulant 61 and back-surface side encapsulant 62 each cover the plurality of solar cells 10 disposed in a matrix.

The plurality of solar cells 10 are entirely covered with encapsulant 60 by being subjected to lamination processing (laminated) in a state where, for example, solar cells 10 are sandwiched between front-surface side encapsulant 61 and back-surface side encapsulant 62 each formed into a sheet.

Specifically, the plurality of solar cells 10 are connected by first lines 20 to form string 10S, and thereafter light reflectors 30 are disposed. Then, front protector 40, front-surface side encapsulant 61, and a plurality of strings 10S are stacked in this order. Next, on the plurality of strings 10S, back-surface side encapsulant 62 and back protector 50 are disposed in this order. Then, the resultant structure prepared by stacking the components in the said order is subjected to thermo compression bonding in a vacuum at a temperature of 100° C. or more, for example. Front-surface side encapsulant 61 and back-surface side encapsulant 62 are heated and melted by the thermo compression bonding. This produces encapsulant 60 which seals solar cells 10.

Front-surface side encapsulant 61 not yet subjected to lamination processing is, for example, a resin sheet including a resin material such as EVA or polyolefin, and is disposed between the plurality of solar cells 10 and front protector 40. Front-surface side encapsulant 61 fills up mainly a space between solar cells 10 and front protector 40 by lamination processing.

Front-surface side encapsulant 61 includes a light-transmitting material. In this embodiment, a transparent resin sheet including EVA is used as front-surface side encapsulant 61 not yet subjected to lamination processing.

Back-surface side encapsulant 62 not yet subjected to lamination processing is a resin sheet including, for example, a resin material such as EVA or polyolefin, and is disposed between the plurality of solar cells 10 and back protector 50. Back-surface side encapsulant 62 fills up mainly a space between solar cells 10 and back protector 50 by lamination processing.

When solar cell module 1 in this embodiment is a monofacial module, back-surface side encapsulant 62 does not have to have light-transmitting properties, and is white in color, for example. In that case, back-surface side encapsulant 62 can reflect light and photoelectric conversion efficiency can be improved also by light that enters back-surface side encapsulant 62.

[1-6. Frame]

Frame 70 is an outer frame which covers the perimeter edge portions of solar cell module 1. Frame 70 is, for example, an aluminum frame. As illustrated in FIG. 1, frame 70 includes four portions fitted on the four sides of solar cell module 1. Frame 70 is bonded to the sides of solar cell module 1 with an adhesive, for example.

It should be noted that solar cell module 1 includes a terminal box for taking out power generated by solar cells 10, which is not illustrated. The terminal box is fixed to back protector 50, for example. The terminal box includes a plurality of circuit components such as a bypass diode.

2. Light Reflected in Solar Cell Module

Next, light reflected by light reflector 30 in solar cell module 1 will be described with reference to FIG. 5A to FIG. 6.

Figure 5A:
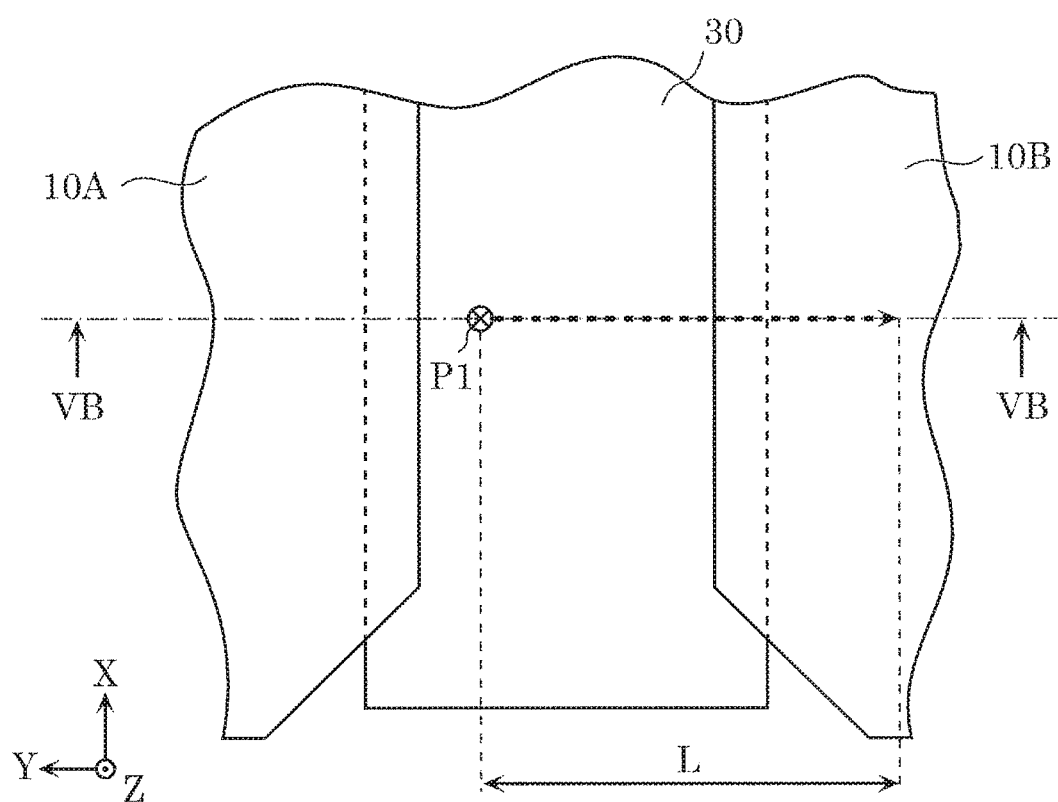
FIG. 5A is a schematic plan view describing a horizontal distance of light reflected in the solar cell module.
Figure 5B:
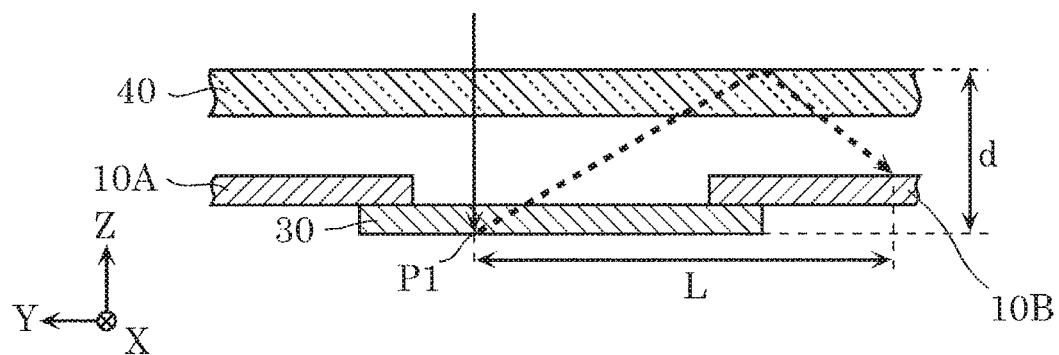
FIG. 5B is a schematic cross-sectional view describing a horizontal distance of light reflected in the solar cell module.
Figure 5C:
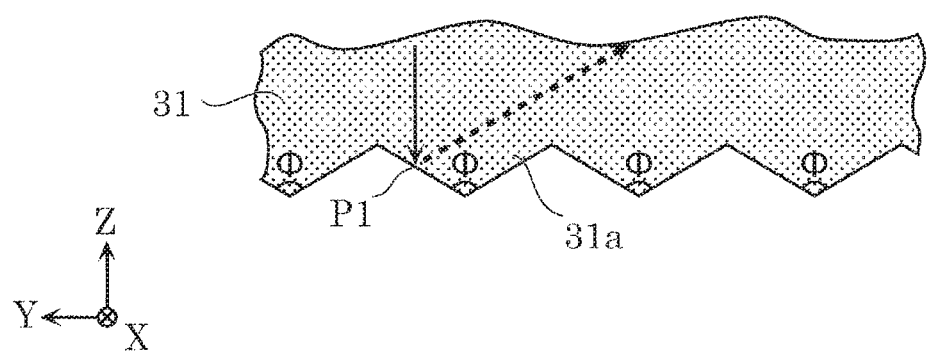
FIG. 5C is an enlarged cross-sectional view of a light-reflective film.

FIG. 5A is a schematic plan view illustrating a horizontal distance of light reflected in solar cell module 1. FIG. 5A illustrates region X surrounded by the dashed line in FIG. 3. It should be noted that, in FIG. 5A, illustration of front-side collector electrode 11 is omitted. Also in the following drawings, illustration of front-side collector electrode 11 is omitted. FIG. 5B is a schematic cross-sectional view illustrating a horizontal distance of light reflected in solar cell module 1. FIG. 5B is a schematic cross-sectional view taken along the VB-VB line of FIG. 5A. FIG. 5C is an enlarged cross-sectional view of light-reflective film 31.

FIG. 5A and FIG. 5B illustrate, as L, a horizontal distance from first point P1 on light reflector 30 to a second point in a horizontal plane including the surface of solar cell 10, of light (sunlight) that is (vertically) incident and reflected at first point P1, subsequently reflected by front protector 40, and reaches the second point. In FIG. 5A and FIG. 5B, the dashed arrows indicate light reflected at first point P1. Also in the following drawings, the dashed arrows indicate light reflected at first point P1. As illustrated in FIG. 5C, since the uneven structure is formed on light-reflective film 31, incident light on light-reflective film 31 is reflected toward solar cell 10 (Y axis direction). The dashed arrows in FIG. 5A to FIG. 5C indicate states in which incident light on first point P1 is reflected only to the right in the Y axis direction, but incident light on first point P1 may be reflected to the left in the Y axis direction, depending on the geometry of protrusions 31a of light-reflective film 31.

In this case, when an apex angle of protrusions 31a of light-reflective film 31 is denoted by $\varphi$(deg) and a distance from the boundary surface between front protector 40 and the exterior space of solar cell module 1 to first point P1 is denoted by d, horizontal distance L is represented by Expression 1 below.

[Math. 1]

$$L = -2d \tan \varphi \quad \text{(Expression 1)}$$

In this case, apex angle $\varphi$ is preferred to be at least 115 degrees and at most 125 degrees.

It should be noted that sunlight is incident on light reflector 30, not only vertically but also from other directions, but horizontal distance L is a horizontal distance of light that is vertically incident and reflected by light reflector 30. This is because, when the incidence direction of sunlight on light reflector 30, which changes from moment to moment during the hours that the sun is out, is averaged, the average incidence direction is the vertical direction. Thus, vertical sunlight is dealt with as representative light of sunlight whose incidence direction changes from moment to moment.

Figure 6:
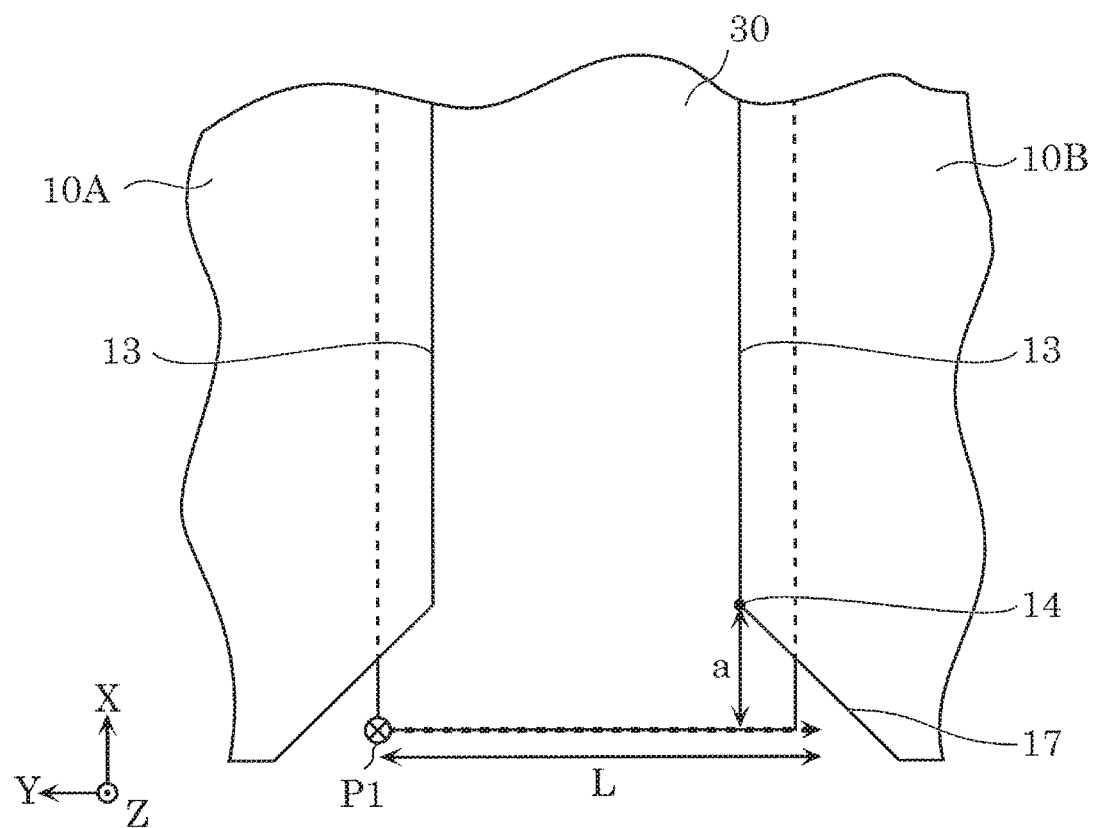
FIG. 6 is a drawing illustrating a case in which light reflected at a vertex of a light reflector fails to reach a solar cell.

Next, the following will describe a case in which sunlight is vertically incident on a vertex (edge portion) of light reflector 30, as illustrated in FIG. 6.

FIG. 6 illustrates a case in which light reflected at the vertex of light reflector 30 fails to reach solar cell 10.

FIG. 6 illustrates first long sides 13 facing one another across the space between the two solar cells 10A and 10B, among the long sides of substantially octagonal solar cell 10, when the two solar cells 10A and 10B are viewed in plan. FIG. 6 also illustrates first short side 17 connected to one end of first long side 13, among the short sides of substantially octagonal solar cell 10. Furthermore, FIG. 6 illustrates intersection 14 which is the point of intersection between first long side 13 and first short side 17. Furthermore, FIG. 6 illustrates protruding length a of light reflector 30 from intersection 14 in the X axis direction.

Since solar cell 10 has chamfered corners, which causes the space between solar cell 10A and solar cell 10B to become large around the corners of solar cells 10, the vertex of light reflector 30 on solar cell 10A side (first point P1), for example, is farthest from solar cell 10B. This means that, when light reflected at first point P1 reaches solar cell 10B, light reflected from any other region of light reflector 30 around the corner also reaches solar cell 10B.

On the other hand, when light reflected at first point P1 fails to reach solar cell 10B, the distance from first point P1 to solar cell 10B becomes large because protruding length a of light reflector 30 is excessive. In other words, since protruding length a of light reflector 30 is excessive, the region around first point P1 becomes a useless region that make no contribution to improving photoelectric conversion efficiency. FIG. 6 illustrates the state in which light reflected at first point P1 fails to reach solar cell 10B. As illustrated in FIG. 6, horizontal distance L is shorter than the distance from first point P1 to the corner of solar cell 10B, and the light reflected at first point P1 fails to reach solar cell 10B.

As stated above, when protruding length a is excessive, regions that make no contribution to improving photoelectric conversion efficiency increase. For this reason, protruding length a is set to improve photoelectric conversion efficiency and reduce an increase in manufacturing costs of solar cell module 1, for example.

Figure 7:
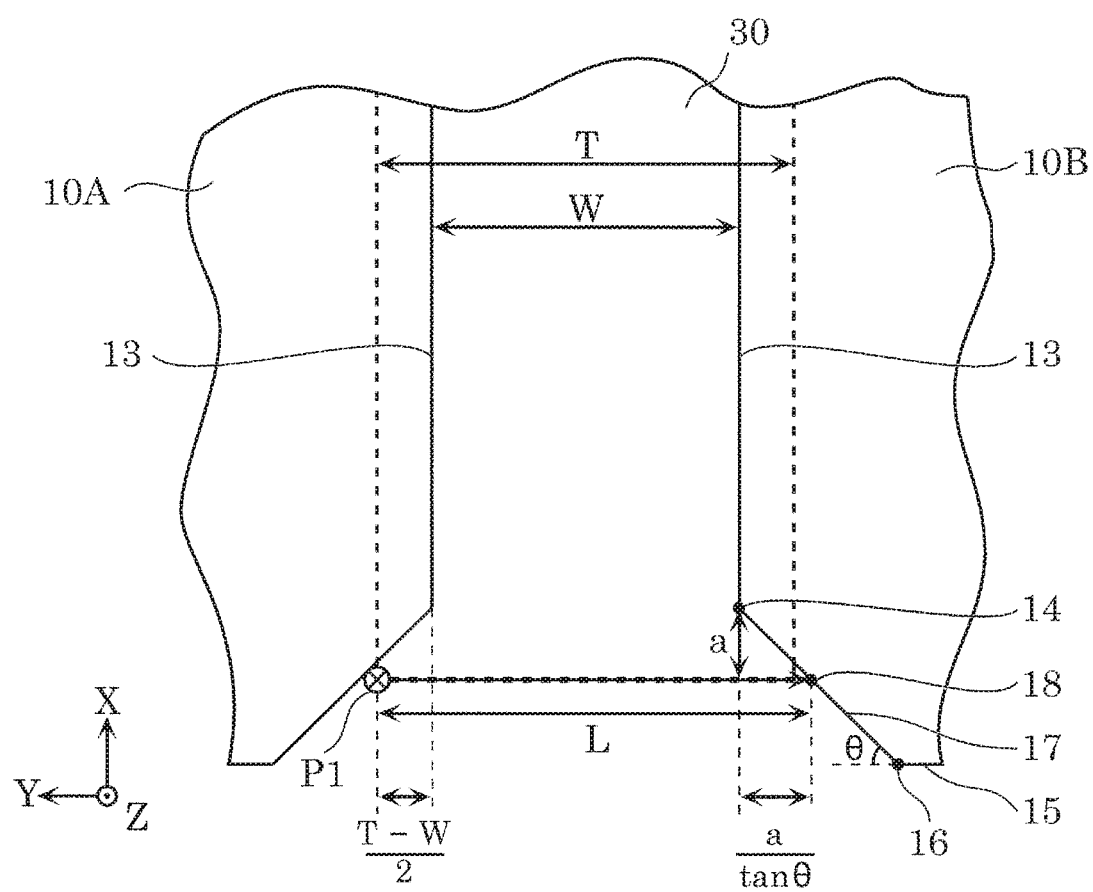
FIG. 7 is a drawing illustrating a case in which light reflected at a vertex of a light reflector reaches a solar cell.

Now therefore, the following will describe a maximum protruding length a, when light reflected at the vertex of light reflector 30 reaches solar cell 10 with reference to FIG. 7.

3. Protruding Length of Light Reflector

FIG. 7 illustrates the case in which light reflected at the vertex of light reflector 30 reaches solar cell 10.

FIG. 7 is a schematic view in the case where horizontal distance L is longer than width T of light reflector 30. FIG. 7 illustrates width W of the space between the two solar cells 10A and 10B (space between first long sides 13), width T of light reflector 30, second long side 15 connected to one end of first short side 17 the other end of which is connected to first long side 13, intersection 16 between second long side 15 and first short side 17, and intersection 18 between the line that passes through the vertex of light reflector 30 and is parallel to the Y axis, and first short side 17. One end of first short side 17 on the side of first long side 13 is intersection 14, and the other end of first short side 17 on the side of second long side 15 is intersection 16. FIG. 7 also illustrates exterior angle $\theta$ at intersection 16 between second long side 15 and first short side 17. The lengths of the four long sides of solar cell 10 having a substantially octagonal shape are equal to one another, and the lengths of the four short sides of solar cell 10 are equal to one another. Therefore, exterior angle $\theta$ is 45 degrees, for example.

In FIG. 7, protruding length a of light reflector 30 is represented as a shortest distance between intersection 14 and the end-most side in the X axis direction of light reflector 30. In the embodiment, light reflector 30 protrudes from intersection 14 in this longitudinal direction to cause light reflected by the uneven structure of light-reflective film 31 to reach solar cell 10. In this case, protruding length a of light reflector 30 from intersection 14 is determined based on width W of the space, width T of light reflector 30, exterior angle $\theta$, and horizontal distance L which is the horizontal distance between the incidence point and the reaching point in the case where light that is incident on light reflector 30 and reaches a horizontal plane including solar cell 10.

More specifically, when the distance from the vertex of light reflector 30 on solar cell 10A side (first point P1) to first short side 17 in the Y axis direction is shorter than horizontal distance L, light reflected at first point P1 reaches solar cell 10. As illustrated in FIG. 7, assuming that light reflector 30 is disposed such that light reflector 30 overlaps solar cell 10A and solar cell 10B equally, the distance from first point P1 to first long side 13 of solar cell 10A in the Y axis direction is expressed in an expression: (T−W)/2. And, the distance from first long side 13 of solar cell 10B to intersection 18 in the Y axis direction is expressed in an expression: a/tan θ. In other words, the distance from first point P1 to first short side 17 in the Y axis direction, expressed in an expression: (T−W)/2+W+a/tan θ, only has to be shorter than horizontal distance L. To summarize, when horizontal distance L is greater than or equal to T, protruding length a is determined based on width W and width T and expressed in Expression 2 below. Under these conditions in which horizontal distance L is long, light reflected at first point P1 easily reaches solar cell 10.

[Math. 2]

$$a < \left(L - \frac{T+W}{2}\right)\tan\theta \qquad \text{(Expression 2)}$$

Figure 8:
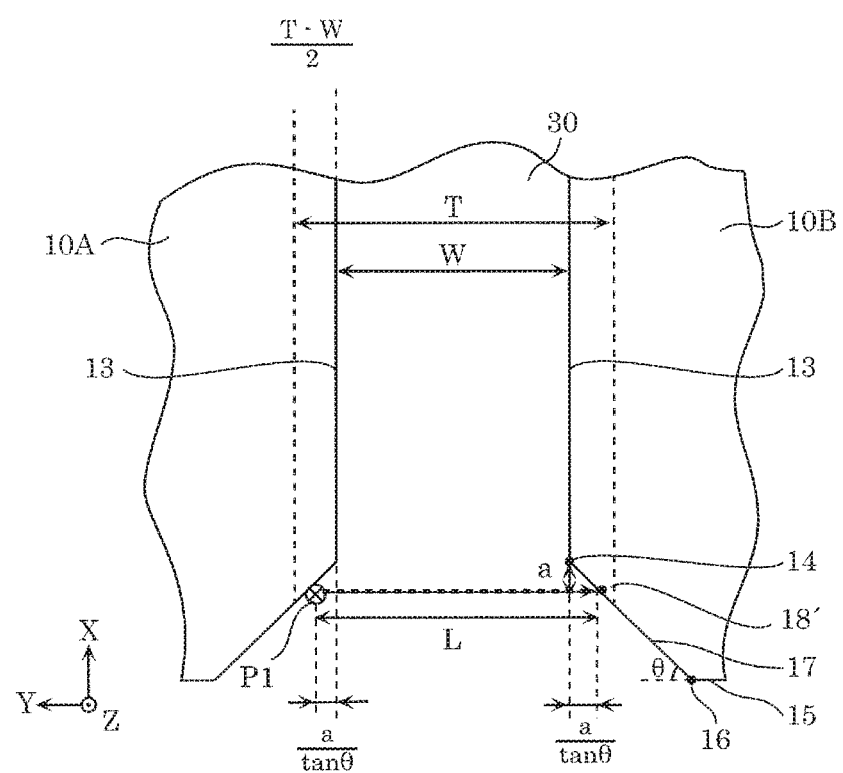
FIG. 8 is a drawing illustrating a case in which light reflected at a vertex of a light reflector reaches a solar cell.

FIG. 8 illustrates width W of the space between the two solar cells 10A and 10B (space between first long sides 13), width T of light reflector 30, second long side 15 connected to one end of first short side 17 the other end of which is connected to first long side 13, intersection 16 between second long side 15 and first short side 17, and intersection 18' between the line that passes through the vertex of light reflector 30 and is parallel to the Y axis, and first short side 17. One end of first short side 17 on the side of first long side 13 is intersection 14, and the other end of first short side 17 on the side of second long side 15 is intersection 16. FIG. 7 also illustrates exterior angle θ at intersection 16 between second long side 15 and first short side 17. When horizontal distance L is less than T, protruding length a is determined based on width W and width T and expressed in Expression 3 below. Under these conditions in which horizontal distance L is short, light reflected at first point P1 hardly reaches solar cell 10, compared with the conditions of Expression 2.

[Math. 3]

$$a < \left(\frac{L-W}{2}\right)\tan\theta \qquad \text{(Expression 3)}$$

Width T of light reflector 30 should be greater than width W of the space, but less than the space between solar cell 10A and solar cell 10B around the corners of solar cell 10, which has been wider because of the chamfered shape of the corners of solar cell 10.

As stated above, when protruding length a is determined based on Expression 2 and Expression 3 above, protruding length a can be made long to such a degree that no region fails to make contribution to improving photoelectric conversion efficiency. In other words, light reflector 30 of which protruding length a is determined based on Expression 2 and Expression 3 is disposed in a region from which more reflected light reaches solar cell 10, not in a region from which less reflected light reaches solar cell 10. This can improve photoelectric conversion efficiency and reduce an increase in manufacturing costs.

Even when width T of light reflector 30 is great and the vertex of light reflector 30 is superimposed on side 17, the space between the corner of solar cell 10A and the corner of solar cell 10B, expressed by 2a/tan θ+W, only has to be narrower than horizontal distance L. To summarize, protruding length a in this case is expressed in Expression 3 above.

When width T of light reflector 30 is greater than the space between the corners, however, regions that make no contribution to improving photoelectric conversion efficiency increase. For this reason, width T of light reflector 30 is narrower than the space, for example.

4. Advantageous Effects and Others

Solar cell module 1 according to this embodiment includes two solar cells 10 adjacent across a space and light reflector 30 that extends over the two solar cells 10 and has an elongated shape. Light reflector 30 also includes light-reflective film 31 and insulating member 32. Furthermore, solar cell module 1 includes front protector 40 that covers the front surfaces of the two solar cells 10 and light reflector 30, and surface-side encapsulant 61 disposed between the two solar cells 10 and light reflector 30, and front protector 40. In a plan view of the two solar cells 10, each of the two solar cells 10 has chamfered corners and a substantially octagonal shape with long sides that are linear and short sides that are linear or non-linear, connected alternately. Light-reflective film 31 has an uneven structure defined by recesses and protrusions 31a that alternate in a direction crossing the longitudinal direction of light reflector 30. Light reflector 30, in a plan view of the two solar cells 10, protrudes in the longitudinal direction from intersection 14 between first long side 13 facing another first long side 13 across the space between the two solar cells 10, among the long sides constituting the substantially octagonal shape, and first short side 17 one end of which is connected to first long side 13, among the short sides constituting the substantially octagonal shape, to cause light reflected by the uneven structure of light-reflective film 31 to reach at least one of the two solar cells 10 (solar cell 10B, for example). In a plan view of the two solar cells 10, the protruding length of light reflector 30 from intersection 14 is determined based on; the width of the space between the two solar cells 10; the width of light reflector 30; the exterior angle at intersection 16 between second long side 15 connected to the other end of first short side 17 and first short side 17; and the horizontal distance from first point P1 on light reflector 30 to a second point in a horizontal plane including at least one of the two solar cells 10, of light that is incident and reflected at first point P1, subsequently reflected by front protector 40, and reaches the second point.

Because of this, it is possible to determine the maximum protruding length of light reflector 30 when light reflected at the edge portion in the longitudinal direction of light reflector 30 that extends over the two solar cells 10 having a substantially octagonal shape and chamfered corners reaches solar cell 10. Specifically, the protruding length of light reflector 30 is determined based on the width of the space between the two solar cells 10, the width of light reflector 30, the shape of the chamfered corners of solar cell 10, and the horizontal distance of light reflected by light reflector 30. Thus, when light reflector 30 is too short, photoelectric conversion efficiency is deteriorated whereas when light reflector 30 is too long, useless regions from which reflected light fails to reach solar cell 10 increase, resulting in increased manufacturing costs (material costs), but based on the parameters stated above, a protruding length enough to make no regions making no contribution to improving photoelectric conversion efficiency can be determined. This can improve photoelectric conversion efficiency and reduce an increase in manufacturing costs.

Furthermore, when the protruding length is denoted by a, the width of the space by W, the width of light reflector 30 by T, the exterior angle by θ, the horizontal distance by L, the apex angle of protrusions 31a by φ, and the distance from the boundary surface between front protector 40 and the exterior space of solar cell module 1 to first point P1 by d, and when horizontal distance L is greater than or equal to T, protruding length a is determined based on Expression 1 and Expression 2 above.

Because of this, when width W of the space, width T of light reflector 30, exterior angle θ and horizontal distance L are known, protruding length a can be determined easily, and this can improve photoelectric conversion efficiency without difficulty and reduce an increase in manufacturing costs.

Additionally, light reflector 30 extends over the back surfaces of the two solar cells 10, and width T of light reflector 30 is greater than width W of the space.

For this reason, when light reflector 30 is disposed on the front surface side of solar cell 10, an effectual region (power generation region) of solar cell 10 may be shaded by light reflector 30 in an overlapping portion of solar cell 10 with light reflector 30, which blocks light from entering the effectual region. In contrast, disposing light reflector 30 on the back surface side of solar cell 10 reduces such blocking of light.

Furthermore, insulating member 32 is disposed between the back surfaces of the two solar cells 10 and light-reflective film 31, and has light-transmitting properties.

This enables light that enters from the front surface side of solar cell 10 to be reflected by the surface on the front surface side of light-reflective film 31.

On the other hand, when horizontal distance L is less than T, protruding length a is determined based on Expression 3 above.

Because of this, when width W of the space, width T of light reflector 30, exterior angle θ and horizontal distance L are known, protruding length a can be determined easily, and this can improve photoelectric conversion efficiency without difficulty and reduce an increase in manufacturing costs.

Furthermore, apex angle φ is at least 115 degrees and at most 125 degrees.

This enables light that enters the space between the two solar cells 10A and 10B to be led to solar cell 10 efficiently. And, this can improve the photoelectric conversion efficiency of the whole solar cell module 1.

Furthermore, solar cell module 1 includes back-surface side encapsulant 62 disposed on the back surface side of the two solar cells 10 and light reflector 30, and back-surface side encapsulant 62 is white in color.

Because of this, back-surface side encapsulant 62 can reflect light, and thus photoelectric conversion efficiency can be improved also by light that enters back-surface side encapsulant 62.

As stated above, incident light on solar cell module 1 varies over time and does not always enter solar cell module 1 vertically. For this reason, when the space between the two solar cells 10 is entirely covered with light reflector 30, the output of solar cell module 1 can be improved more. However, light reflector 30 leads light that enters between solar cells 10 to solar cell 10 on either side, but light reflected by light reflector 30 around a corner of solar cell 10 is highly unlikely to reach solar cell 10 because the distance from light reflector 30 to solar cell 10 is large around the corners. In other words, when the space between the two solar cells 10 is entirely covered with light reflector 30, regions that make a significant contribution to improving the output and regions that make a little contribution to improving the output are generated. In this embodiment, however, photoelectric conversion efficiency can be improved by reducing useless regions that make no contribution to improving photoelectric conversion efficiency and reducing an increase in manufacturing costs from light reflector 30.

Other Embodiments

The above completes description of solar cell module 1 according to the present disclosure based on the foregoing embodiment, yet the present disclosure is not limited to the embodiment described above.

For example, in the foregoing embodiment, solar cell 10 has short sides that are linear but is not limited to such. For example, solar cell 10 may have short sides that are non-linear, such as curbed short sides. When solar cell 10 has curbed short sides, first short side 17 is regarded as a chord corresponding to an arc at a corner of solar cell 10.

Furthermore, for example, light reflectors 30 are disposed in the spaces among all strings 10S in the foregoing embodiment but may be disposed in only some spaces. In other words, light reflector 30 only has to be disposed between at least two solar cells 10A and 10B and there may be spaces between solar cell 10A and solar cell 10B, in which no light reflector is provided.

Furthermore, for example, in the foregoing embodiment, light reflector 30 extends over the two solar cells 10A and 10B, each of which is included in a different string 10S adjacent one another, which is not limited to such. For example, light reflector 30 may extend over two solar cells 10A which are included in one string 10S, or two solar cells 10B which are included in another string 10S.

Furthermore, for example, in the foregoing embodiment, light-reflective film 31 is formed on the entire surface of insulating member 32, which is not limited to such. For example, a portion of light-reflective film 31 between the two adjacent solar cells 10A and 10B may be severed. Accordingly, even when light-reflective film 31 comes into contact with solar cell 10, leakage current is prevented from occurring between adjacent solar cells 10 via conductive light-reflective film 31.

Furthermore, for example, adhesive member 33 may include a plurality of air spaces in the foregoing embodiment. The air spaces are, for example, air bubbles included in an air layer.

When light reflector 30 is bonded to solar cell 10 by thermo compression bonding, light reflector 30 may warp due to heat contraction of insulating member 32 which is a PET layer. Consequently, solar cell 10 may break, and desired reflective characteristics of light reflector 30 may not be achieved. Thus, stress caused by the heat contraction of insulating member 32 may be directly transferred to solar cell 10, and solar cell 10 may crack.

In view of this, adhesive member 33 serving as an adhesion layer for light reflector 30 and solar cell 10 may include a plurality of air spaces. This reduces stress caused by the heat contraction of insulating member 32. In other words, stress caused by the heat contraction of insulating member 32 is consumed to fill the air spaces, and thus stress transferred to solar cell 10 can be reduced. As a result, light reflector 30 can be prevented from warping. Accordingly, solar cell 10 can be prevented from cracking, and thus productivity and reliability of solar cell module 1 improve.

Furthermore, for example, although the semiconductor substrate of solar cell 10 is an n-type semiconductor substrate in the foregoing embodiment, the semiconductor substrate may be a p-type semiconductor substrate.

Furthermore, for example, in the foregoing embodiment, the solar cell module may be a monofacial module in which only front protector 40 serves as a light-receiving surface, but may also be a bifacial module in which both front protector 40 and back protector 50 serve as light-receiving surfaces.

Furthermore, for example, in each of the foregoing embodiments, a semi-conducting material of the photoelectric converter of solar cell 10 is silicon but is not limited to such. Examples of the semi-conducting material of the photoelectric converter of solar cell 10 may include Gallium arsenide (GaAs) or indium phosphide (InP).

The present disclosure may also include embodiments as a result of various modifications that may be conceived by those skilled in the art, and embodiments obtained by combining elements and functions in the embodiments in any manner without departing from the spirit of the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell module, comprising:
    two solar cells, which are a first solar cell and a second solar cell, adjacent one another across a space;
    a light reflector that extends over the two solar cells, includes a light-reflective film and an insulating member, and has an elongated shape;
    a front protector that covers front surfaces of the two solar cells and the light reflector; and
    a front-surface side encapsulant disposed between (i) the two solar cells and the light reflector and (ii) the front protector, wherein
    in a plan view of the two solar cells, each of the two solar cells has a substantially octagonal shape with long sides and short sides that are connected alternately,
    the light-reflective film has an uneven structure defined by recesses and protrusions that alternate in a direction crossing a longitudinal direction of the light reflector,
    the two solar cells are arranged such that a first long side extending in the longitudinal direction among the long sides of the first solar cell faces a second long side extending in the longitudinal direction among the long sides of the second solar cell with the space,
    the light-reflective film is disposed to cover the first long side and the second long side and the space,
    the light reflector, in the plan view, protrudes in the longitudinal direction from a first short side among the short sides of the first solar cell, which is connected to the first long side, and a second short side among the short sides of the second solar cell, which is connected to the second long side, to cause light reflected by the uneven structure of the light-reflective film to reach at least one of the two solar cells,
    in the plan view, a protruding length a of the light reflector from an intersection, which is a distance between the intersection of the first long side and the first short side to an end of the light reflector in the longitudinal direction and 0<a, satisfies the following relationship:

$$a < \left(L - \frac{T+W}{2}\right)\tan\theta,$$

where L is greater than or equal to T, or $$a < \left(\frac{L-W}{2}\right)\tan\theta,$$

where L is less than T,
where L=−2d tanφ, and
W is a width of the space; T is a width of the light reflector; θ is an exterior angle at an intersection between a third long side among the long sides of the first solar cell, which is connected to the first short side, and the first short side; L is a horizontal distance from a first point on the light reflector to a second point in a horizontal plane including the at least one of the two solar cells, of light that is incident and reflected at the first point, subsequently reflected by the front protector, and reaches the second point; φ is an apex angle of one of the protrusions at the first point, and d is a distance from a boundary surface between the front protector and exterior space of the solar cell module to the first point.

2. The solar cell module according to claim 1, wherein the light reflector extends over back surfaces of the two solar cells, and the width of the light reflector is greater than the width of the space.

3. The solar cell module according to claim 2, wherein the insulating member is disposed between the back surfaces of the two solar cells and the light-reflective film, and has light-transmitting properties.

4. The solar cell module according to claim 1, wherein the apex angle φ of the protrusions is at least 115 degrees and at most 125 degrees.

5. The solar cell module according to claim 1, further comprising:
    a back-surface side encapsulant disposed on a back-surface side of the two solar cells and the light reflector, wherein
    the back-surface side encapsulant is white in color.

* * * * *